(12) United States Patent  
Nidhi

(10) Patent No.: US 9,048,858 B1  
(45) Date of Patent: Jun. 2, 2015

(54) MEAN FREQUENCY CALIBRATION FOR A VOLTAGE CONTROLLED OSCILLATOR BASED ANALOG-TO-DIGITAL CONVERTER

(71) Applicant: IQ-Analog Corporation, San Diego, CA (US)

(72) Inventor: Nitin Nidhi, San Diego, CA (US)

(73) Assignee: IQ-Analog Corporation, San Diego, CA (US)

(*) Notice: Subject to any disclaimer, the term of this patent is extended or adjusted under 35 U.S.C. 154(b) by 0 days.

(21) Appl. No.: 14/617,980

(22) Filed: Feb. 10, 2015

(51) Int. Cl.
*H03M 1/10* (2006.01)
*H03M 1/60* (2006.01)
*H03M 1/64* (2006.01)

(52) U.S. Cl.
CPC ............ *H03M 1/1009* (2013.01); *H03M 1/60* (2013.01); *H03M 1/64* (2013.01)

(58) Field of Classification Search
CPC ..... H03M 1/162; H03M 1/167; H03M 3/334; H03M 3/43; H03M 3/454; H03M 5/145; H03M 1/002; H03M 1/1019; H03M 1/466
USPC .................. 341/120, 155, 157; 318/268, 600; 331/11, 16, 34
See application file for complete search history.

(56) References Cited

U.S. PATENT DOCUMENTS

| | | | |
|---|---|---|---|
| 5,189,420 A * | 2/1993 | Eddy et al. | 341/157 |
| 6,396,890 B1 * | 5/2002 | Turner | 375/376 |
| 6,809,676 B1 * | 10/2004 | Younis et al. | 341/157 |
| 8,542,138 B2 | 9/2013 | Galton | |
| 8,760,333 B2 | 6/2014 | Op 'T Eynde | |
| 2007/0229118 A1 * | 10/2007 | Kobayashi et al. | 327/3 |
| 2011/0074475 A1 * | 3/2011 | Akaike et al. | 327/156 |

OTHER PUBLICATIONS

Park et al., "A 0.13βm CMOS 78dB SNDR 87mW 20MHZ BW CT ADC with VCO-Based Integrator and Quantizer", 2009 IEEE Inter. Solid-State Circuits Conf. Session 9.5.
Park et al., "A 78 dB SNDR 87 mW 20 MHz Bandwidth Continuous-Time delta E ADC with VCO-Based Integrator and . . . ", IEEE J. of Solid-State Circuits, vol. 44, No. 12, Dec. 2009.
Straayer et al., "A Multi-Path Gated Ring Oscillator TDC With First-Order Noise Shaping", IEEE J. of Solid-State Circuits, vol. 44, No. 4, Apr. 2009.

* cited by examiner

*Primary Examiner* — Jean B Jeanglaude
(74) *Attorney, Agent, or Firm* — Law Office of Gerald Maliszewski; Gerald Maliszewski

(57) ABSTRACT

A method is provided for calibrating the mean frequency of a voltage controlled oscillator (VCO) based analog-to-digital converter (ADC). The method accepts a differential analog input signal comprising a positive signal and a negative signal. The positive signal is converted into a first frequency and the negative signal is converted into a second frequency. The first frequency is converted into a first digital value and the second frequency is converted into a second digital value. The first digital value is added to the second digital value to find a common mode value, and the common mode value is compared to a predetermined common mode value to find a first error. The first error is converted to a first bias modification of the differential analog input signal, and in response to the differential analog input first bias modification, the first error is minimized.

20 Claims, 9 Drawing Sheets

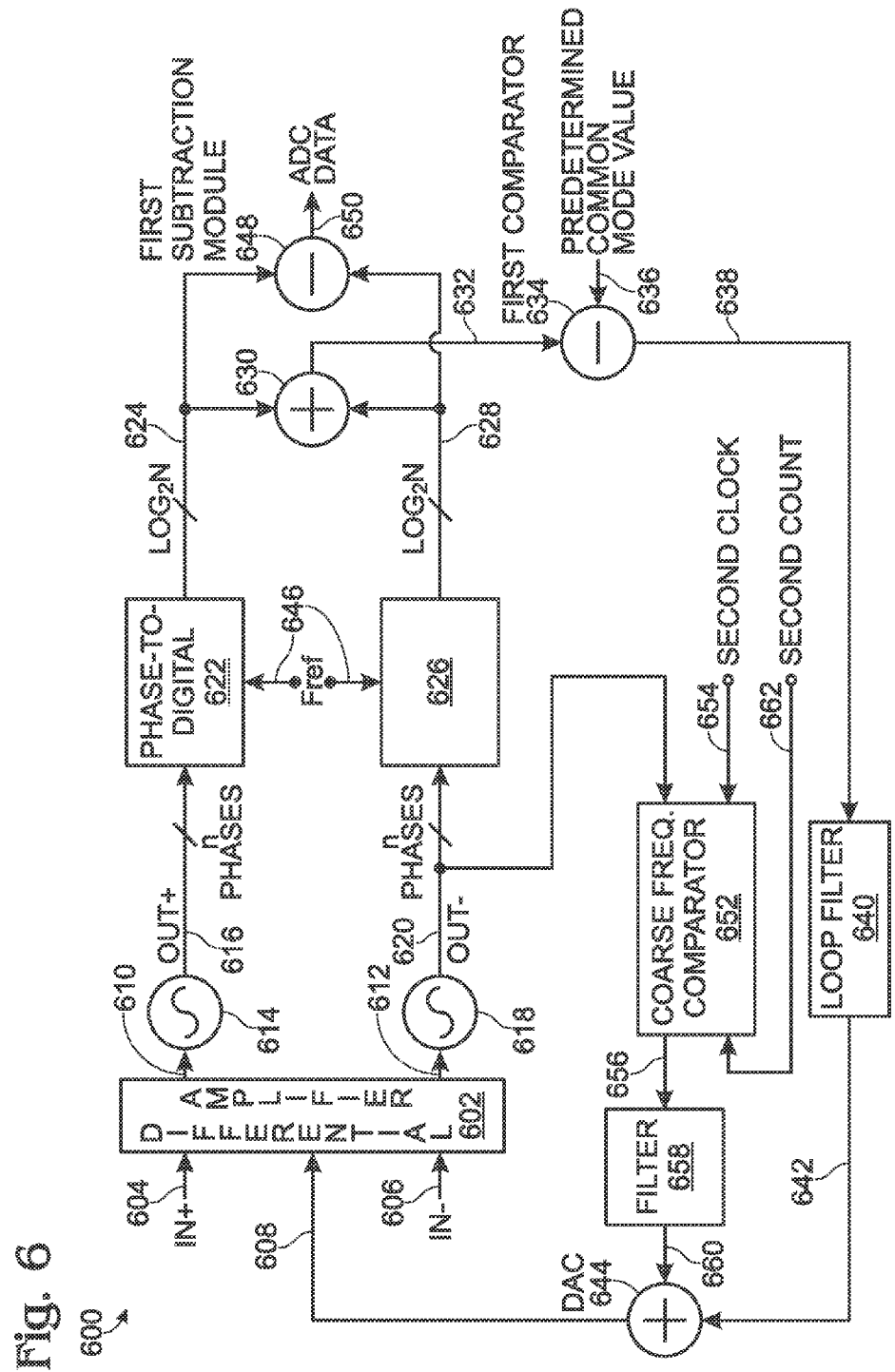

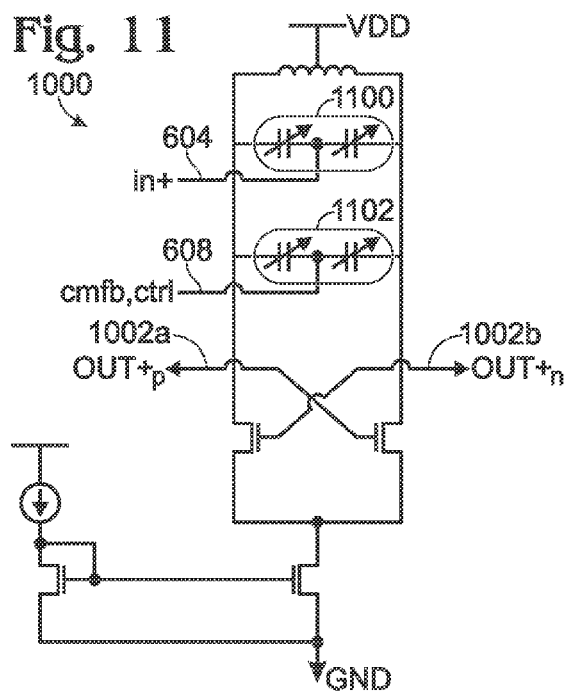

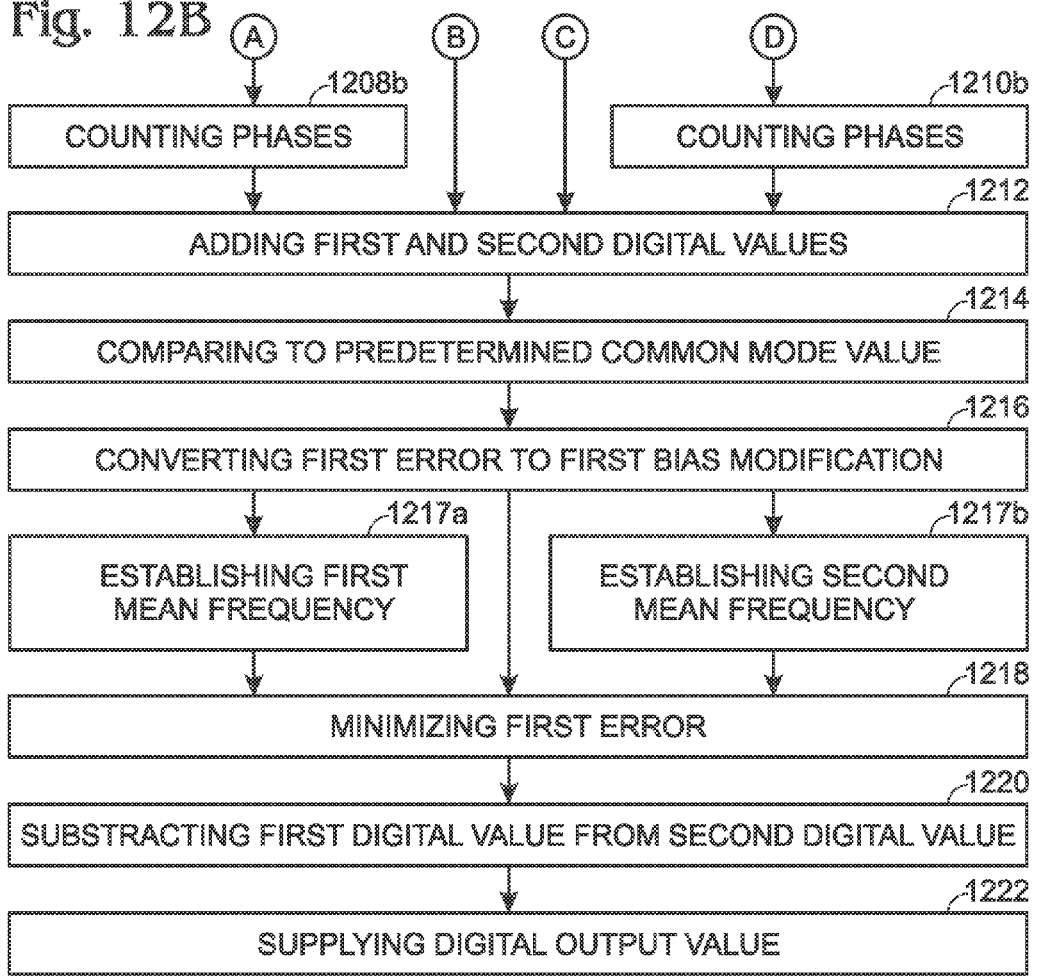

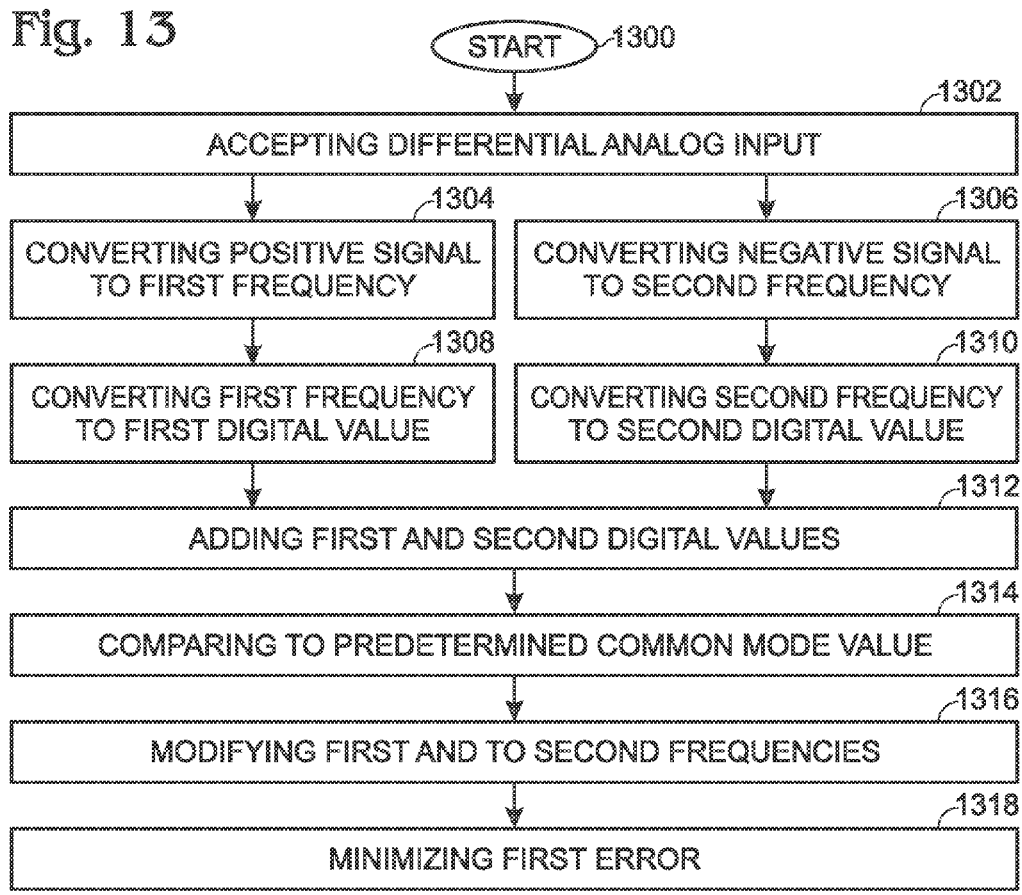

MEAN FREQUENCY CALIBRATION FOR A VOLTAGE CONTROLLED OSCILLATOR BASED ANALOG-TO-DIGITAL CONVERTER

BACKGROUND OF THE INVENTION

1. Field of the Invention

This invention generally relates to analog-to-digital converters (ADCs) and, more particularly, to a system and method for calibrating the mean frequency of a voltage controlled oscillator (VCO) based ADC.

2. Description of the Related Art

ADC converters are widely used in electronics circuits. The performance of an ADC is dependent on the performance of its components. For a monolithic ADC, the components are transistors, such as metal-oxide-semiconductor field effect transistors (MOSFETs) and bipolar junction transistors (BJTs). Year after year, the unity gain frequency ($f_T$) of transistors has been improved by advances in device engineering. Although, an improvement in $f_T$ translates into an improvement in inverter delay, it does not necessary improve all the performance metrics critical for an analog circuit design. For instance, the output resistance of devices has degraded over the years. ADC design involves both analog and digital circuit blocks. The analog blocks involved in conventional ADC architectures like pipelined, flash, etc. may not take full advantage of improvements in $f_T$. However, one recent ADC architecture—the VCO based ADC—benefits from a direct relationship between ADC performance and the $f_T$ of its devices. Hence, this ADC architecture will greatly benefit from this trend.

FIG. 1 is a schematic block diagram of a VCO based ADC (prior art). Such an ADC can achieve very high performance, comparable to other wide-spread conventional ADC architectures. A differential input signal drives a pseudo-differential VCO directly or through a voltage-to-current (V-to-I) block 100. The multiphase outputs of each VCO, 102 and 104, are sampled by a clock and converted to an equivalent digital word, by phase-to-digital blocks 106 and 108. A difference of the two digital outputs is taken to obtain the ADC output. During normal operation, as the input voltage to either of the two VCO increases, the corresponding oscillation frequency of that VCO also increases.

FIG. 2 is a graph depicting an exemplary relationship between VCO control voltage and output frequency (prior art). The phase-to-digital blocks compute the sum of level changes (both high to low and low to high) within each clock cycle of the sampling clock, for each of the n phases of an n-phase VCO.

FIG. 3 is a schematic diagram depicting an exemplary phase-to-digital circuit (prior art).

FIG. 4 is a graph depicting the relationship between the sampling clock frequency (Fs) and VCO frequency (prior art). The digital output of each phase-to-digital block is proportional to VCO frequency, which is the input frequency for the phase-to-digital block. However, the values wrap around between 0 and the full scale output. The full scale output is set by the number of phases in the VCO. Clearly, input signals causing the VCO to remain within each band of operation (0 to $F_S/2$, $F_S/2$ to Fs, $F_S$ to $3F_S/2$, etc.) are digitized linearly, except for weak non-linearities due to V2I, the VCOs, and phase-to-digital blocks. Whenever the VCO frequency spills over from one band of operation to an adjacent band, another source of non-linearity is triggered due to the wrapping of phase-to-digital output, which becomes a dominant source as the spillover increases. Hence, the VCOs should be constrained within only one band during normal operation. The dynamic range is maximized when the digital output of the phase-to-digital blocks is centered at half of its full scale output, referred to herein as the mid-reference frequency. For example, in the band between $F_S/2$ and $F_S$, the VCO frequency is centered around $3*F_S/4$. This mean VCO frequency is set by the VCO oscillation frequency when V2I is driven by an input common-mode voltage, or in other words, when the differential input is absent. Due to process variations, the mean frequency can be significantly higher or lower than the desired $3*F_S/4$. A VCO mean frequency calibration loop is therefore required to adjust the VCO parameters so that the mean VCO frequency is equal to the mid-reference frequency.

FIG. 5 is a schematic block diagram depicting a VCO based ADC that addresses the problem of VCO mean frequency calibration. In this design, a third replica VCO is used, which is driven by common-mode input voltage. The frequency measurement of this replica VCO is used to drive the VCO mean frequency towards mid-reference. However, this approach increases the power consumption due to the addition of a VCO and a phase-to-digital converter to the ADC. The design also suffers from errors due to a mismatch between the nominal and the replica VCO. The reference designators associated with this figure are described in FIG. 3 of U.S. Pat. No. 8,542,138, the entirety of which is incorporated herein by reference.

It would be advantageous if the mean frequency of a VCO based ADC could be calibrated without the use of an additional replica VCO.

SUMMARY OF THE INVENTION

Disclosed herein is a voltage controlled oscillator (VCO) based analog-to-digital converter (ADC). In this design, a sum of the two phase-to-digital outputs is taken and used to drive a negative feedback loop, so that VCO mean frequency is adjusted to the desired mid-reference frequency. In this way, the power and area penalty of a third VCO and phase-to-digital block is avoided.

Accordingly, a method is provided for calibrating the mean frequency of a VCO based ADC. The method accepts a differential analog input signal comprising a positive signal and a negative signal. The positive signal is converted into a first frequency and the negative signal is converted into a second frequency. The first frequency is converted into a first digital value and the second frequency is converted into a second digital value. The first digital value is added to the second digital value to find a common mode value, and the common mode value is compared to a predetermined common mode value to find a first error. The first error is converted to a first bias modification of the differential analog input signal, and in response to the differential analog input first bias modification, the first error is minimized. The first digital value is subtracted from the second digital value, and as a result, a digital output value is supplied that is equivalent to the differential analog input value.

In one aspect, converting the positive signal into the first frequency includes converting to a first frequency represented with n phases, where n is a positive integer greater than 1. Likewise, converting the negative signal into the second frequency includes converting to a second frequency represented with n phases. Then, converting the first frequency into the first digital value includes sampling the n phases of the first frequency at a first reference clock rate, and counting a first number of phase changes for the first frequency, per first reference clock period. Likewise, converting the second frequency into the second digital value includes sampling the n phases of the second frequency at the first reference clock rate, and counting a second number of phase changes for the second frequency, per first reference clock period. As a result, the step of adding the first digital value to the second digital value includes adding the first number to the second number.

More particularly, in response to the first bias modification, the method establishes a first mean frequency equal to ((a first maximum frequency+a first minimum frequency)/2), while simultaneously establishing a second mean frequency equal to ((a second maximum frequency+a second minimum frequency)/2).

In another aspect, prior to accepting the differential analog input signal (e.g., when the ADC is first enabled), the first and second frequencies are potentially able to operate in association with an unknown or undesirable one of a plurality of reference clock frequency bands. Then, the method counts the number of cycles in either the first or second frequency using a second reference clock, divided down from the first reference clock, to create a first count. The first count is then compared to a second count associated with a mid-reference frequency in a selected reference clock frequency band, to find a second error. The second error is converted into a second bias modification of the differential analog input signal. In response to the second bias modification, the first and second frequencies operate in association with the selected reference clock frequency range. Preferably, the selected reference clock frequency band is in the range of a minimum frequency equal to (the reference clock frequency/2) and a maximum frequency equal to the reference clock frequency.

Additional details of the above-described method and a VCO based ADC device are provided below.

BRIEF DESCRIPTION OF THE DRAWINGS

FIG. 6 is a schematic block diagram of a novel VCO based ADC.

FIG. 7 is a schematic diagram depicting a single stage of a multi-stage ring oscillator, FIG. 9 is an associated timing diagram.

FIG. 11 is a schematic of an exemplary LC-VCO with a single output, such as might be used in the ADC of FIG. 10.

FIGS. 12A and 12B are a first flowchart illustrating a method for calibrating the mean frequency of a VCO based ADC.

FIG. 13 is a second flowchart illustrating a method for calibrating the mean frequency of a VCO based ADC.

DETAILED DESCRIPTION

Figure 1:
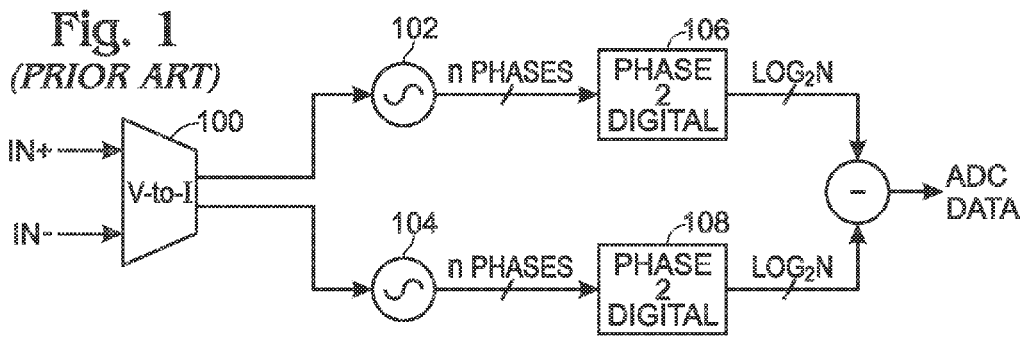
FIG. 1 is a schematic block diagram of a VCO based ADC (prior art).
Figure 2:
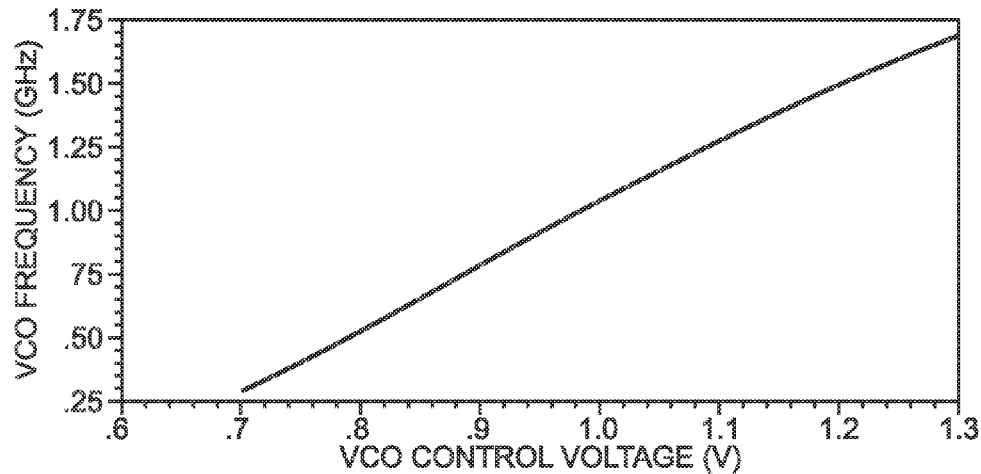
FIG. 2 is a graph depicting an exemplary relationship between VCO control voltage and output frequency (prior art).

FIG. 6 is a schematic block diagram of a novel VCO based ADC. The ADC 600 comprises a differential amplifier 602 having an input to accept a differential analog input signal, in+ on line 604 and in− on line 606, and an input on line 608 to accept bias control signals. The differential amplifier 602 has an output to supply a positive signal on line 610 and a negative signal on line 612. As understood in the art, the so-called positive signal typically has the same peak-to-peak voltage as the so-called negative, but with an opposite phase. A large variety of differential amplifier types are known in the art. Alternatively, but not shown, the input may be a single-ended signal which is converted into a differential output (positive and negative signal), as would be understood by one with skill in the art. A first VCO 614 has an input on line 610 to accept the positive signal and an output on line 616 to supply a first frequency responsive to the positive signal. A second VCO 618 has an input on line 612 to accept the negative signal and an output on line 620 to supply a second frequency responsive to the negative signal. As explained in more detail below, the first VCO 614 and second VCO 618 output a plurality of (n) phases at their respective first and second frequencies, such as might be realized by ring oscillator.

A first phase-to-digital circuit 622 has an input on line 616 to accept the first frequency and an output on line 624 to supply a first digital value responsive to the first frequency. A second phase-to-digital circuit 626 has an input on line 620 to accept the second frequency and an output on line 628 to supply a second digital value responsive to the second frequency.

A first summing module 630 has inputs on lines 624 and 628 to respectively accept the first digital value and the second digital value. The first summing module 630 adds the first digital value to the second digital value to supply a common mode value at an output on line 632. A first comparator 634 has an input on line 632 to accept the common mode value, an input on line 636 to accept a predetermined (desired) common mode value, and an output on line 638 to supply a first error signal in response to comparing the common mode value to the predetermined common mode value. In one aspect, the predetermined common mode value is actual twice the desired common mode value to compensate for the addition of the first and second digital values. Optionally, the ADC 600 may additionally comprise a lowpass loop filter 640 for loop stability, which supplies a filtered first error signal on line 642. Ultimately, the differential amplifier 602 accepts a first bias modification control signal on line 608 that is responsive to the first error signal on line 638. In response to the first bias modification control signal on line 608, the first comparator 634 supplies a minimized first error signal, with a value smaller than the initial first error signal, indicating that VCOs 614 and 618 are being driven to a desired mean frequency. The error feedback and correction eventually drive the two VCOs towards the desired mean frequency.

More explicitly, the first comparator 634 accepts digital inputs and therefore supplies a digital first error signal. Typically therefore, the ADC 600 may further comprise a digital-to-analog converter (DAC) 644 having an input to accept the digital first error signal, or as shown, a filtered digital first error signal on line 642, and an output on line 608 to supply an analog first bias modification control signal. In this case, loop filter 640 is a digital loop filter.

In one aspect, the first VCO 614 supplies the first frequency on line 616 represented with n phases, where n is a positive integer greater than 1. Likewise, the second VCO 618 supplies the second frequency on line 620 represented with n phases. Alternatively stated, each VCO has n outputs, all at the same frequency, but with a number of different phases. The first phase-to-digital circuit 622 has an input on line 646 to accept a first reference clock (Fref), and the first phase-to-digital circuit samples the n phases of the first frequency at a first reference clock rate. As a result, the first number supplied on line 624 is a count of phase changes for the first frequency, per first reference clock period. Likewise, the second phase-to-digital circuit 626 has an input on line 646 to accept the first reference clock. The second phase-to-digital circuit 626 samples the n phases of the second frequency at the first reference clock rate, and supplies as the second number on line 628, a count of phase changes for the second frequency, per first reference clock period. The first summing module 630 adds the first number to the second number.

In another aspect, the ADC 600 further comprises a first subtraction module 648 having an input on line 624 to accept the first digital value (the first number) and an input on line 628 to accept the second digital value (the second number). The first subtraction module 648 subtracts the second digital value from the first digital value to supply a digital output value on line 650, which is equivalent to the differential analog input value.

As used herein, the mean frequency refers to the average frequency of the VCOs. The mid-reference frequency of the VCOs is the frequency midway between the VCO maximum output frequency and the VCO minimum output frequency. Thus, the first VCO 614 first mean frequency is equal to the first VCO mid-reference frequency ((a first maximum frequency+a first minimum frequency)/2), in response to the first bias modification control signal. The second VCO 618 second mean frequency is equal to ((a second maximum frequency+a second minimum frequency)/2), in response to the first bias modification control signal. Further, the first subtraction module 648 supplies a mean digital value in response to the first and second mean frequencies.

Alternatively stated, the ADC 600 has a differential input (in+, in−) and differential output (out+, out−). The mean value of out+ and the mean value of out− are equal. The feedback loop compensation of the ADC causes the mean value of the differential output to be equal to half of the ADC's maximum digital output. The ADC digital output varies about the mean value and is symmetrical about it. So if mean value is Vo,cm, then ADC output varies between Vo,cm+Vo,diff/2 and Vo,cm−Vo,diff/2. If Vo,cm+Vo,diff/2 reaches the maximum output possible (e.g., 256 for an 8-bit ADC), the output clips and causes distortion. Also, if Vo,cm−Vdiff/2 reaches below 0, then also the output clips and causes distortion. Hence, the calibration loop sets Vo,cm to half of the maximum allowable value of the ADC (e.g., 128 for the case of 8-bit ADC, where maximum is 256), so the input signal can be maximized without the ADC hitting distortion limits on the high or the low side.

Figure 4:
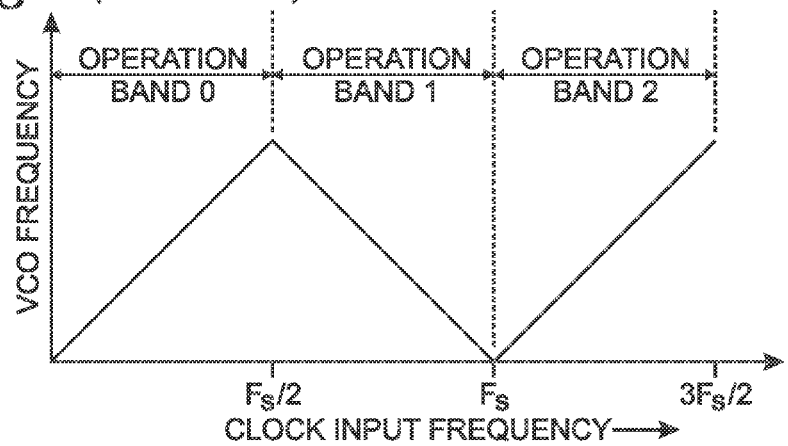
FIG. 4 is a graph depicting the relationship between the sampling clock frequency (Fs) and VCO frequency (prior art).
Figure 3:
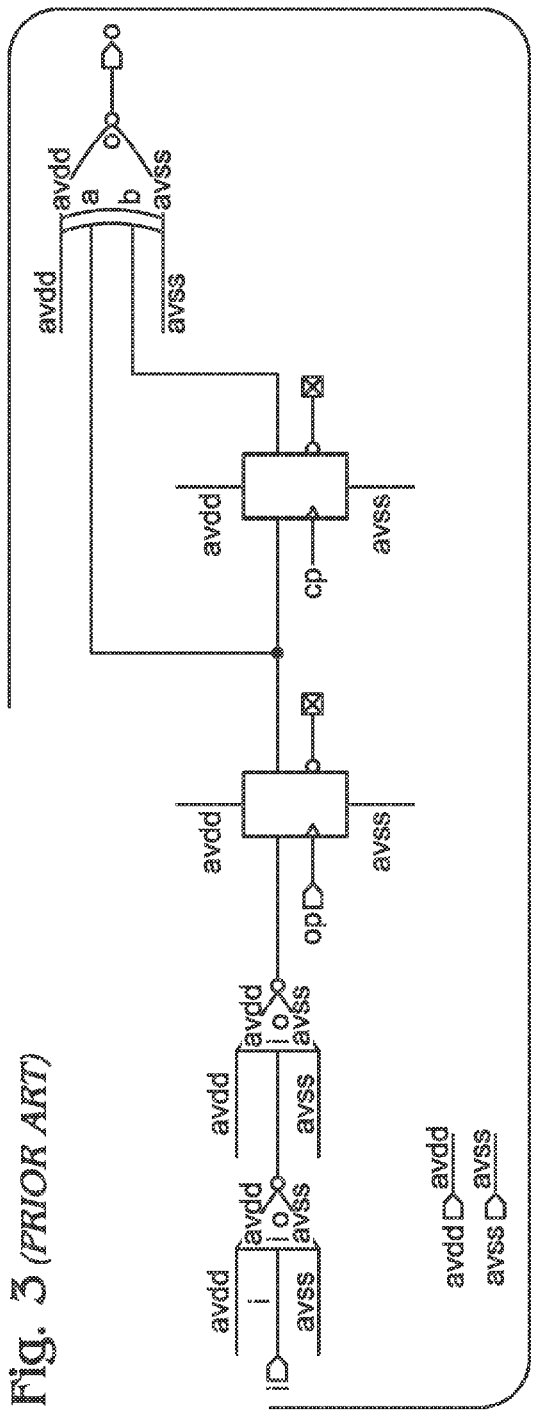
FIG. 3 is a schematic diagram depicting an exemplary phase-to-digital circuit (prior art).

As described above in the explanation of FIG. 4, it is typical that the first VCO 614 and second VCO 618 are capable of supplying first and second frequencies, respectively, operating in association with one of a plurality of reference clock frequency bands. So in a different aspect, the ADC 600 may further comprise a coarse frequency comparator 652 having an input connected to either the first VCO output on line 616, or as shown, the second VCO output on line 620. Either VCO output is acceptable. The coarse frequency comparator 652 also has an input on line 654 to accept a second reference clock derived from the first reference clock. The coarse frequency comparator 652 counts the number of cycles in the selected (e.g., second) VCO frequency per second reference clock period to create a first count. The coarse frequency comparator 652 also has an input on line 662 to accept a second count associated with the mid-reference frequency in a selected (desired) reference clock frequency band. Typically, the second reference clock frequency is divided down from the first reference clock frequency. The coarse frequency comparator 652 compares the first count to the second count, and has an output on line 656 to supply a second error signal in response to comparing the first and second counts. Optionally, the second error signal may be filtered by filter 658 to supply a filtered second error signal on line 660. Ultimately, the differential amplifier 602 accepts a second bias modification control signal on line 608 in response to the second error signal. After the loop settles, the first VCO 614 and second VCO 618 respectively supply first and second frequencies associated with the selected reference clock frequency band, in response to the second bias modification control signal. Typically, the second error signal is digital, so that the filter 658 is a digital integrator, and the DAC 644 is used to convert the (integrated) second error signal to an analog second bias modification control signal.

For example, assuming that the mid-reference frequencies of the VCOs is 0.75 gigahertz (GHz) and the first reference clock frequency is 1 GHz, the potential reference clock frequency bands are: 0-0.5 GHz, 0.5 to 1 GHz, 1-1.5 GHz, etc. In this example, the 0.5 to 1 GHz reference clock frequency band is selected and a second reference clock frequency of 62.5 megahertz (MHz) is used, which is equal to the first reference clock divided by 16, to measure the VCO frequency. The value of 1 denotes 62.5 MHz and 16 denotes a frequency of 1600 MHz, with step sizes of 62.5 MHz in between. Since the desired mid-reference frequency is 0.75 GHz (750 MHz) and the selected reference clock frequency band is 0.5 to 1 GHz, the loop settles in response to a second count of 12 (i.e. 12×62.5 MHz=750 MHz). If the selected reference clock frequency had, alternatively, been selected to be in the range of 1 to 1.5 GHz, the second count would be set equal to 20, associated with the mid-reference frequency of 1250 MHz (20×62.5=1250).

It is also typical that the coarse frequency comparator 652 ceases to compare the first count to the second count, or supply the second error value, a predetermined duration of time subsequent to enabling the ADC. That is, once the VCOs are locked to the selected reference clock frequency band, this calibration is no longer necessary.

Alternatively stated, the loop creating the phase-to-digital output sum on line 632, can potentially move towards a non-desired mean frequency if the VCOs doesn't start-up in the desired band of operation. The ADC described herein eliminates this problem by using coarse frequency tuning when the ADC is enabled and then moving over to the fine frequency control loop after the coarse frequency tuning has completed. A negative feedback loop using the output of the coarse frequency comparator 652 minimizes the error between the measured frequency and the desired frequency. The shown implementation uses a digital integrator 658 whose output is fed to DAC 644, which modulates the bias current of the differential amplifier 602. It should be noted that while it is known to use a combination of coarse and a fine feedback loops to adjust the frequency of a VCO in the context of digital PLL, no such implementation is known for use with differential VCOs, and more particularly, a pseudo-differential VCO-based ADC.

For an n-phase ring VCO, the output can range between 0 and n, thereby resulting in a floor($\log_2 n$) bit ADC. For example, for a VCO with 64 phases, the output is in the range from 0 to 63 (6'b000000 to 6'b111111), resulting in a 6 bit ADC. The quantization noise of a VCO based ADC is determined by the number of distinct phases available from the VCO. The number of phases of a ring VCO can be increased by increasing the number of stages in the VCO, for example 64 stages can be increased to 128. However, if the number of stages is increased while keeping the unit inverter delay fixed, VCO mean frequency becomes half, thereby reducing the ADC bandwidth. Hence, the number of stages must be increased without decreasing VCO mean frequency. This goal can be obtained by simultaneously decreasing the delay of a unit inverting stage forming the VCO. Hence, an increase from 64 to 128 stages should be accompanied by a 2× reduction in unit inverter delay.

Figure 8:
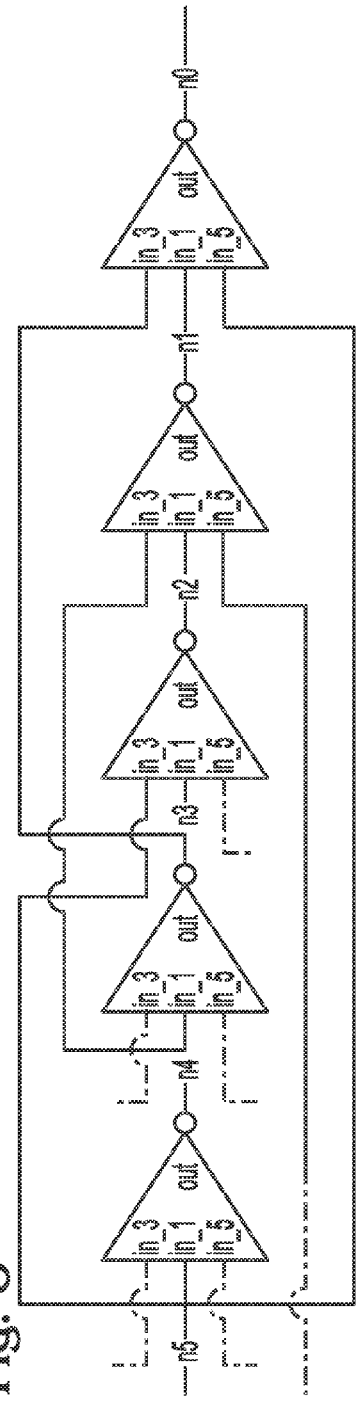
FIG. 8 depicts multiple stages connected in series.
Figure 5:
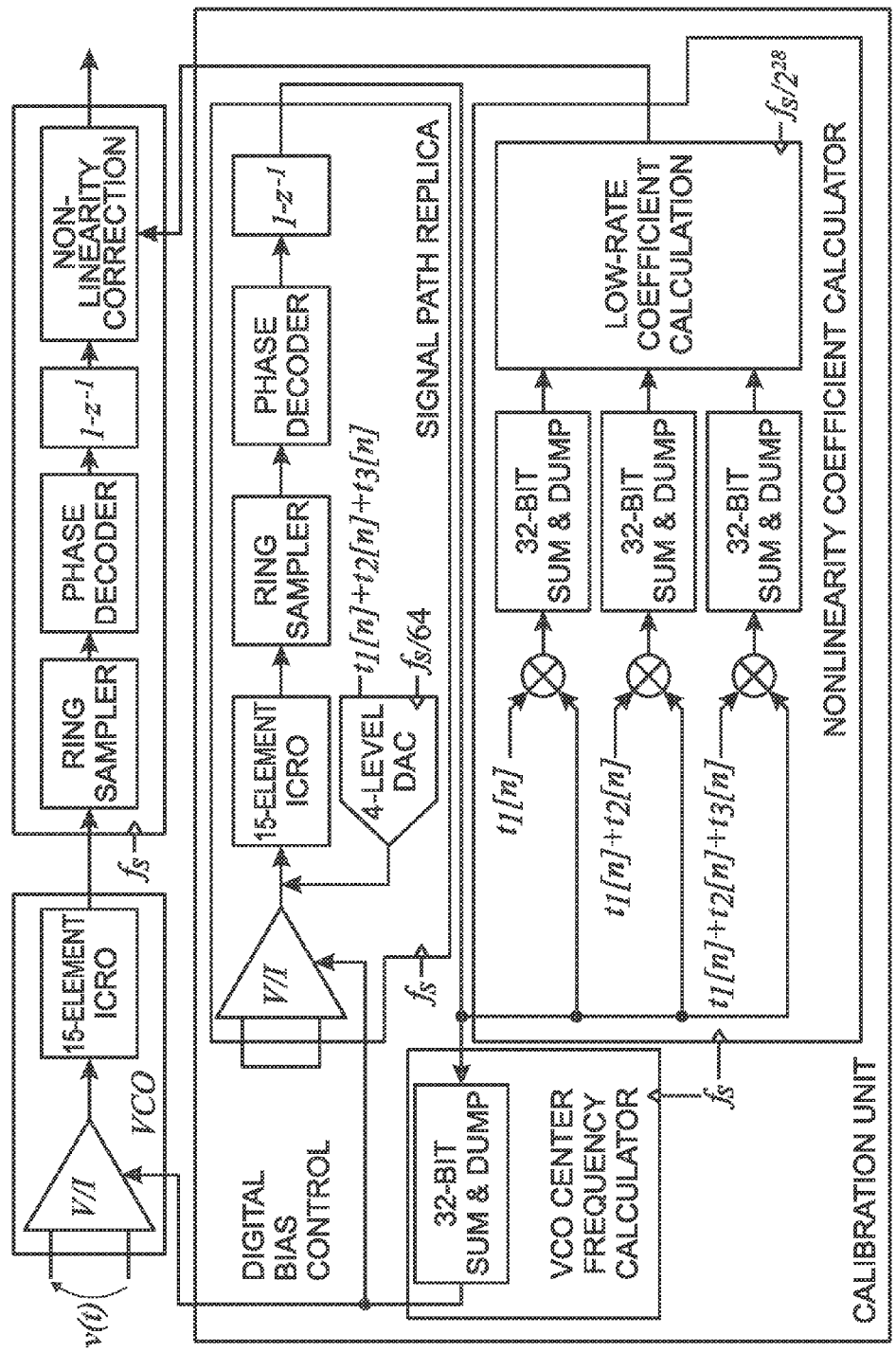
FIG. 5 is a schematic block diagram depicting a VCO based ADC that addresses the problem of VCO mean frequency calibration.

FIG. 7 is a schematic diagram depicting a single stage of a multi-stage ring oscillator, FIG. 8 depicts multiple stages connected in series, and FIG. 9 is an associated timing diagram. One method for reducing inverter delay involves using a modified inverter cell, as shown in FIG. 7. A standard inverter has one device for pull-up and another device for pull-down. Both of the two devices are driven by the same signal. The modification involves using multiple devices for pull-up and pull-down, where each device is driven by more than one signal, where each one of them is appropriately advanced or delayed in time. Although such inverter ring VCOs are known in the art, their application in decreasing the unit cell delay of the VCO used in a VCO based ADC has until now been unappreciated.

The modified inverter has three inputs in this example ("in_1", "in_3" and "in_5"), and one output "out" (FIG. 7). VDD of the ring-inverter VCO is the frequency controlling input, and VDD and GND of all the inverters are tied together.

The chain of inverters forming the ring VCO is shown in FIG. 8. For simplification in the drawing, the VDD and GND nodes of the inverters are not shown. If the last inverter (rightmost) of FIG. 8 is examined, its input "in_1" is driven by "n1", input "in_3" is driven by "n3" and input "in_5" is driven by "n5". FIG. 9 shows how "n3" is ahead of time in going from low-to-high as compared to "n1", and similarly, how "n5" is ahead of time in going from low-to-high as compared to "n3". Due to this feature, the output of the inverter "n0" starts its transition from high-to-low before "n1" goes high, thereby decreasing the time-difference between n1's low-to-high transition and n0's high-to-low transition. This time difference is the inverter delay which, therefore, is reduced. The pull-up and pull-down devices connected to "in_3" and "in_5" ("n3" and "n5" in the current example), are sized smaller compared to the device connected to "in_1", so that the transition takes place only when "in_1" transitions, which ensures output transition only when the "in_1" transitions. Similar connection and operation descriptions apply to all the inverters in the chain, where the connections to "in_3" and "in_5" inputs come from succeeding previous stages.

Figure 10:
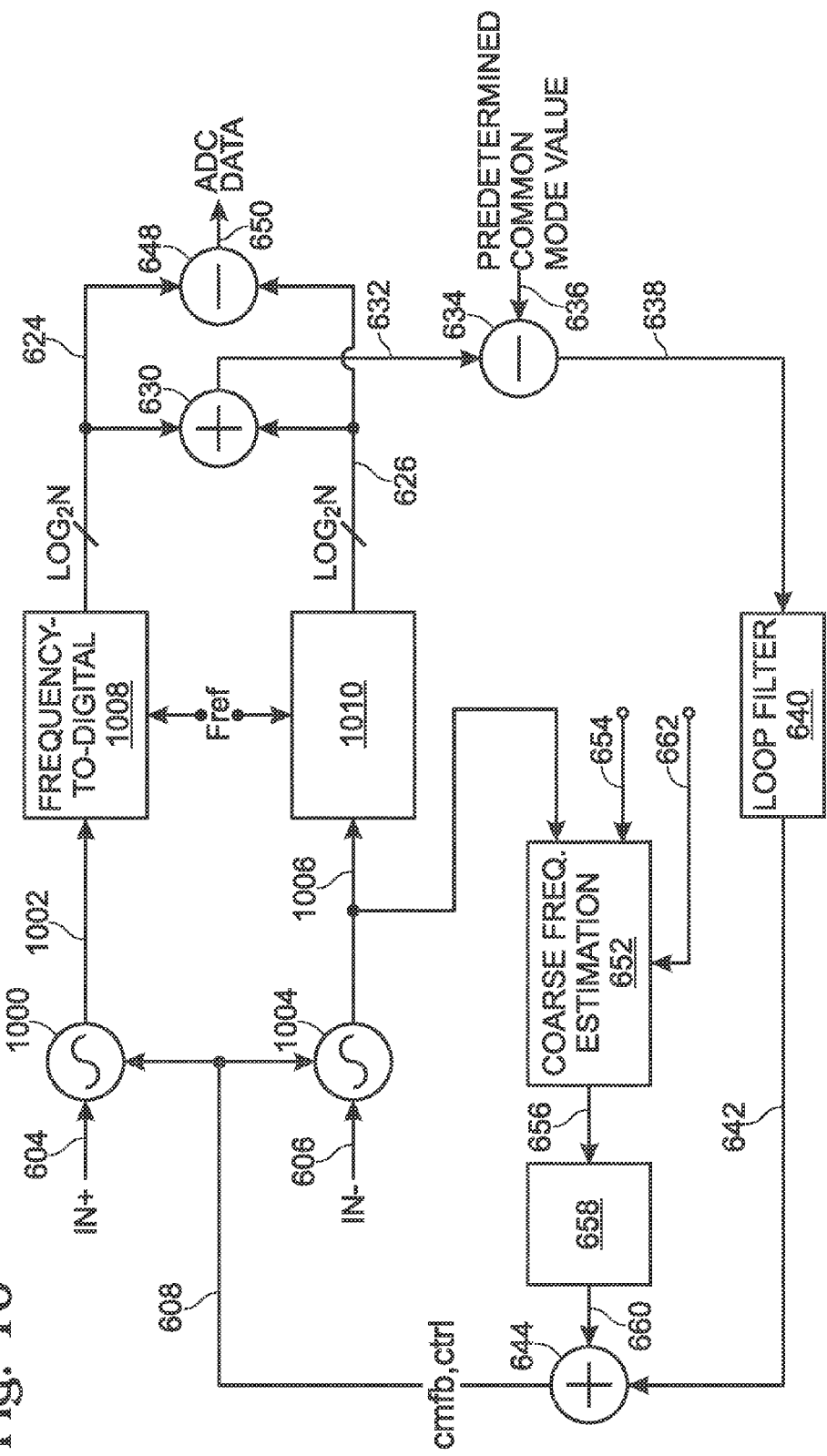
FIG. 10 is a schematic block diagram depicting another implementation of a VCO based ADC using single phase (i.e. a single output) VCOs.

FIG. 10 is a schematic block diagram depicting another implementation of a VCO based ADC using single phase (i.e. single output) VCOs. A frequency counter is used to find the digital equivalent of an analog input signal. The principle of controlling the mean output frequency remains the same in this case, but the multiphase VCO followed by a phase-to-digital block (FIG. 6) is replaced with a single phase VCO followed by a frequency-to-digital block.

A first VCO 1000 has an input on line 604 to accept a positive signal portion of a differential input signal, an input on line 608 to accept a frequency control signal, and an output on line 616 to supply a first frequency responsive to the positive signal. A second VCO 1004 has an input on line 606 to accept the negative signal portion of the differential input signal, an input on line 608 to accept the frequency control signal, and an output on line 1006 to supply a second frequency responsive to the negative signal. A first frequency-to-digital circuit 1008 has an input on line 1002 to accept the first frequency and an output on line 624 to supply a first digital value responsive to the first frequency. A frequency-to-digital circuit can be enabled as a frequency counter, and a number of different types of frequency counters are known in the art. A second frequency-to-digital circuit 1010 has an input on line 1006 to accept the second frequency and an output on line 626 to supply a second digital value responsive to the second frequency.

As in the ADC of FIG. 6, the first summing module 630 has an input on line 624 to accept the first digital value, and an input on line 626 to accept the second digital value. The first summing module 630 adds the first digital value to the second digital value to supply a common mode value at an output on line 632. The first comparator 634 has an input on line 632 to accept the common mode value, an input on line 636 to accept the predetermined common mode value, and an output on line 638 to supply a first error signal in response to comparing the common mode value to the predetermined common mode value. Optionally, filter 640 may be used.

The first subtraction module 648 has an input on line 624 to accept the first digital value and an input on line 626 to accept the second digital value. The first subtraction module 648 subtracts the second digital value from the first digital value to supply a digital output value, equivalent to the differential analog input value, at an output on line 650.

As a result, the first VCO 1000 and second VCO 1004 accept a fine frequency modification control signal, responsive to the first error signal, and the first comparator 634 supplies a minimal first error signal value. That is, the value of the first error signal decreases in response to the fine frequency modification control signal. The first and second VCOs operate at their mid-reference frequencies in response to the fine frequency modification control signal. After the transient response dies, the first and second VCOs operate at a mean frequency equal to the mid-reference frequency in response to fine frequency modification control signals.

As in FIG. 6, the ADC may further comprise a coarse frequency comparator 652 having an input connected to either the first VCO output, or as shown, the second VCO output on line 1006. Either VCO output is acceptable. The coarse frequency comparator 652 also has an input on line 654 to accept a second reference clock and an input on line 662 to accept a second count on line 662 associated with the mid-reference frequency of a selected reference clock frequency band. The coarse frequency comparator 652 supplies a second error signal at an output on line 656 in response to comparing the first and second counts, as described in more detail above. Optionally, the second error signal may be filtered by filter 658 to supply a filtered second error signal on line 660. Ultimately, the first VCO 1000 and second VCO 1004 accept a coarse frequency modification control signal on line 608 in response to the second error signal. As a result, the first VCO 1000 and second VCO 1004 respectively supply first and second frequencies associated with the selected reference clock frequency band, in response to the coarse frequency modification control signal. Typically, the second error signal is digital, so that the filter 658 is a digital integrator, and the DAC 644 is used to convert the (integrated) second error signal to analog frequency modification control signals.

FIG. 11 is a schematic of an exemplary LC-VCO with a single output, such as might be used in the ADC of FIG. 10. Each VCO has two frequency control inputs. As shown, the first VCO 1000 has input in+ on line 604 and input cmfb,ctrl on line 608. The inputs are connected to varactors 1100 and 1102, which control the frequency of the VCO. Many other types of VCO designs are known in the art, which would be suitable to enable the ADC of FIG. 10.

Figure 12A:
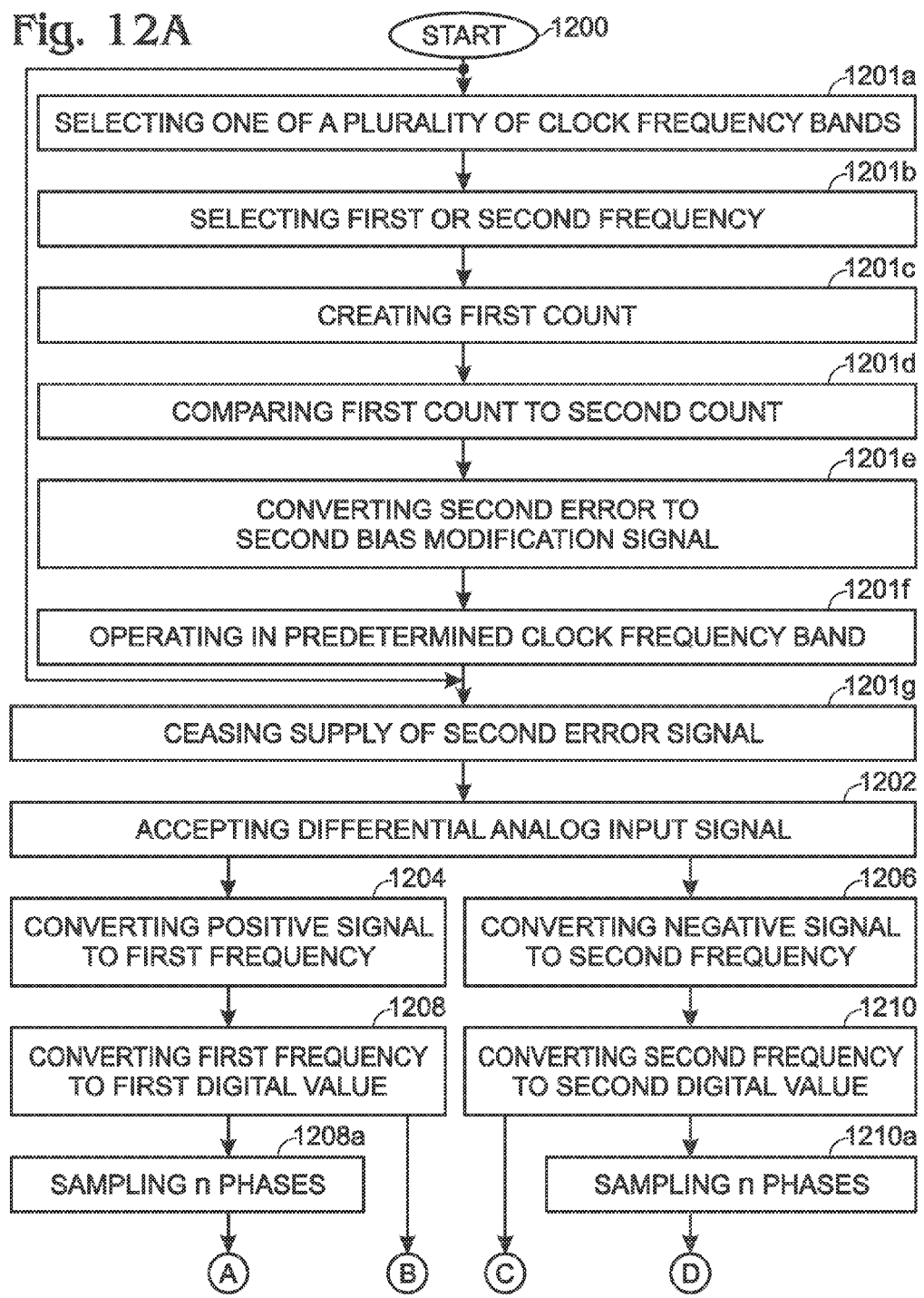

FIGS. 12A and 12B are a first flowchart illustrating a method for calibrating the mean frequency of a VCO based ADC. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1200.

Step 1202 accepts a differential analog input signal comprising a positive signal and a negative signal. Step 1204 converts the positive signal into a first frequency and Step 1206 converts the negative signal into a second frequency. Step 1208 converts the first frequency into a first digital value, and Step 1210 converts the second frequency into a second digital value. Step 1212 adds the first digital value to the second digital value to find a common mode value. Step 1214 compares the common mode value to a predetermined common mode value to find a first error. Step 1216 converts the first error to a first bias modification of the differential analog input signal. In response to the differential analog input first bias modification, Step 1218 minimizes the first error. Step 1220 subtracts the first digital value from the second digital value, and Step 1222 supplies a digital output value equivalent to the differential analog input value.

In one aspect, converting the positive signal into the first frequency in Step 1204 includes converting to a first frequency represented with n phases, where n is a positive integer greater than 1. Likewise, Step 1206 converts to a second frequency represented with n phases. Then, converting the first frequency into the first digital value in Step 1208 includes substeps. Step 1208a samples the n phases of the first frequency at a first reference clock rate, and Step 1208b counts a first number of phase changes for the first frequency, per first reference clock period. Likewise, Step 1210 includes substeps. Step 1210a samples the n phases of the second frequency at the first reference clock rate, and Step 1210b counts a second number of phase changes for the second frequency, per first reference clock period. As a result, Step 1212 adds the first number to the second number.

In response to the first bias modification of Step 1216, Step 1217a establishing a first mean frequency equal to the VCO mid-reference frequency, which is ((a first maximum frequency+a first minimum frequency)/2). Step 1217b establishes a second mean frequency equal to ((a second maximum frequency+a second minimum frequency)/2). Further, supplying the digital output value in Step 1222 includes supplying a mean digital value in response to establishing the first and second mean frequencies.

In one aspect, prior to accepting the differential analog input signal, in Step 1201a one of a plurality of reference clock frequency bands is selected. Step 1201b selects either the first frequency or the second frequency. Step 1201c counts the number of cycles in the selected frequency using a second reference clock frequency derived from the first reference clock frequency, to create a first count. Step 1201d compares to the first count to a second count associated with a mid-reference frequency in the selected reference clock frequency band, to find a second error. Step 1201e converts the second error into a second bias modification of the differential analog input signal. In response to the second bias modification, Step 1201f operates the first and second frequencies in association with the selected reference clock frequency range. In another aspect, the selected reference clock frequency band is in the range of a minimum frequency equal to (the reference clock frequency/2) and a maximum frequency equal to the reference clock frequency. Subsequent to a predetermined duration of time after enabling the ADC, Step 1201g ceases the compare the first and second counts, or supply the second error signal.

FIG. 13 is a second flowchart illustrating a method for calibrating the mean frequency of a VCO based ADC. The method begins at Step 1300. Step 1302 accepts a differential analog input signal comprising a positive signal and a negative signal. Step 1304 converts the positive signal into a first frequency. Step 1306 converts the negative signal into a second frequency. Step 1308 converts the first frequency into a first digital value, and Step 1310 converts the second frequency into a second digital value. Step 1312 adds the first digital value to the second digital value to find a common mode value, and Step 1314 compares the common mode value to a predetermined common mode value to find a first error. In response to the first error, Step 1316 modifies the first and second frequencies, and in response to the modifying the first and second frequencies, Step 1318 minimizes the first error.

A system and method have been provided for calibrating the mean frequency of a VCO based ADC. Examples of hardware units and method steps have been presented to illustrate the invention. However, the invention is not limited to merely these examples. Other variations and embodiments of the invention will occur to those skilled in the art.

I claim:

1. A method for calibrating the mean frequency of a voltage controlled oscillator (VCO) based analog-to-digital converter (ADC), the method comprising:
    accepting a differential analog input signal comprising a positive signal and a negative signal;
    converting the positive signal into a first frequency;
    converting the negative signal into a second frequency;
    converting the first frequency into a first digital value;
    converting the second frequency into a second digital value;
    adding the first digital value to the second digital value to find a common mode value;
    comparing the common mode value to a predetermined common mode value to find a first error;
    converting the first error to a first bias modification of the differential analog input signal; and,
    in response to the differential analog input first bias modification, minimizing the first error.

2. The method of claim 1 wherein converting the positive signal into the first frequency includes converting to a first frequency represented with n phases, where n is a positive integer greater than 1;
    wherein converting the negative signal into the second frequency includes converting to a second frequency represented with n phases;
    wherein converting the first frequency into the first digital value includes:
        sampling the n phases of the first frequency at a first reference clock rate;
        counting a first number of phase changes for the first frequency, per first reference clock period;
    wherein converting the second frequency into the second digital value includes:
        sampling the n phases of the second frequency at the first reference clock rate;
        counting a second number of phase changes for the second frequency, per first reference clock period;

wherein adding the first digital value to the second digital value includes adding the first number to the second number.

3. The method of claim 1 further comprising:
subtracting the first digital value from the second digital value; and,
supplying a digital output value equivalent to the differential analog input value.

4. The method of claim 3 further comprising:
in response to the first bias modification:
establishing a first mean frequency equal to ((a first maximum frequency+a first minimum frequency)/2); and,
establishing a second mean frequency equal to ((a second maximum frequency+a second minimum frequency)/2).

5. The method of claim 4 wherein supplying the digital output value includes supplying a mean digital value in response to establishing the first and second mean frequencies.

6. The method of claim 1 further comprising:
prior to accepting the differential analog input signal, selecting one of a plurality of reference clock frequency bands;
choosing a frequency selected from a group consisting of the first frequency and the second frequency;
counting a number of selected frequency cycles per second reference clock period, creating a first count, wherein the second clock period is derived from the first clock period;
comparing the first count to a second count associated with a mid-reference frequency in the selected reference clock frequency band, to find a second error;
converting the second error into a second bias modification of the differential analog input signal;
in response to the second bias modification, operating the first and second frequencies in association with the selected reference clock frequency range.

7. The method of claim 6 wherein comparing the first count to the second count includes the selected reference clock frequency band being in the range of a minimum frequency equal to (the reference clock frequency/2) and a maximum frequency equal to the reference clock frequency.

8. The method of claim 6 further comprising:
subsequent to a predetermined duration of time after enabling the ADC, ceasing to find the second error.

9. A voltage controlled oscillator (VCO) based analog-to-digital converter (ADC), the ADC comprising:
a differential amplifier having an input to accept a differential analog input signal, an input to accept bias control signals, and an output to supply a positive signal and a negative signal;
a first VCO having an input to accept the positive signal and an output to supply a first frequency responsive to the positive signal;
a second VCO having an input to accept the negative signal and an output to supply a second frequency responsive to the negative signal;
a first phase-to-digital circuit having an input to accept the first frequency and an output to supply a first digital value responsive to the first frequency;
a second phase-to-digital circuit having an input to accept the second frequency and an output to supply a second digital value responsive to the second frequency;
a first summing module having an input to accept the first digital value, an input to accept the second digital value, the first summing module adding the first digital value to the second digital value to supply a common mode value at an output;
a first comparator having an input to accept the common mode value, an input to accept a predetermined common mode value, and an output to supply a first error signal in response to comparing the common mode value to the predetermined common mode value;
wherein the differential amplifier accepts a first bias modification control signal, responsive to the first error signal; and,
wherein the first comparator supplies a minimized first error signal in response to the first bias modification control signal.

10. The ADC of claim 9 wherein the first comparator supplies a digital first error signal;
the ADC further comprising:
a digital-to-analog converter having an input to accept the digital first error signal and an output to supply an analog first bias modification control signal.

11. The ADC of claim 9 wherein the first VCO supplies the first frequency represented with n phases, where n is a positive integer greater than 1;
wherein the second VCO supplies the second frequency represented with n phases;
wherein the first phase-to-digital circuit has an input to accept a first reference clock, the first phase-to-digital circuit sampling the n phases of the first frequency at a first reference clock rate, and supplying as a first number, a count of phase changes for the first frequency, per first reference clock period;
wherein the second phase-to-digital circuit has an input to accept the first reference clock, the second phase-to-digital circuit sampling the n phases of the second frequency at the first reference clock rate, and supplying as a second number, a count of phase changes for the second frequency, per first reference clock period; and,
wherein the first summing module adds the first number to the second number.

12. The ADC of claim 9 further comprising:
a first subtraction module having an input to accept the first digital value and an input to accept the second digital value, the first subtraction module subtracting the second digital value from the first digital value to supply a digital output value, equivalent to the differential analog input value, at an output.

13. The ADC of claim 12 wherein the first VCO supplies a first mean frequency equal to ((a first maximum frequency+a first minimum frequency)/2), in response to the first bias modification control signal; and,
wherein the second VCO supplies a second mean frequency equal to ((a second maximum frequency+a second minimum frequency)/2), in response to the first bias modification control signal.

14. The ADC of claim 13 wherein the first subtraction module supplies a mean digital value in response to the first and second mean frequencies.

15. The ADC of claim 9 further comprising:
a coarse frequency comparator having an input connected to a VCO output selected from a group consisting of the first VCO or the second VCO and an input to accept a second reference clock derived from the first reference clock, the coarse frequency comparator counting a number of cycles in the selected VCO frequency per second reference clock period to create a first count, comparing the first count to a second count input associated with a mid-reference frequency in a selected reference clock frequency band, and supplying at an output a second error signal in response to comparing the first count to the second count;

wherein the differential amplifier accepts a second bias modification control signal, in response to the second error signal; and, wherein the first and second VCOs respectively supply first and second frequencies associated with the selected reference clock frequency band, in response to the second bias modification control signal.

16. The ADC of claim 15 wherein the coarse frequency comparator accepts a second count for a selected reference clock frequency band having a minimum frequency equal to (the reference clock frequency/2) and a maximum frequency equal to the reference clock frequency.

17. The ADC of claim 15 wherein the coarse frequency comparator ceases to supply the second error signal after a predetermined duration of time subsequent to enabling the ADC.

18. The ADC of claim 9 wherein the first and second VCOs are multipath ring inverter oscillators.

19. A voltage controlled oscillator (VCO) based analog-to-digital converter (ADC), the ADC comprising:

a first VCO having an input to accept a positive signal portion of a differential input signal, an input to accept a frequency control signal, and an output to supply a first frequency responsive to the positive signal;

a second VCO having an input to accept the negative signal portion of the differential input signal, an input to accept the frequency control signal, and an output to supply a second frequency responsive to the negative signal;

a first frequency-to-digital circuit having an input to accept the first frequency and an output to supply a first digital value responsive to the first frequency;

a second frequency-to-digital circuit having an input to accept the second frequency and an output to supply a second digital value responsive to the second frequency;

a first summing module having an input to accept the first digital value, an input to accept the second digital value, the first summing module adding the first digital value to the second digital value to supply a common mode value at an output;

a first comparator having an input to accept the common mode value, an input to accept a predetermined common mode value, and an output to supply a first error signal in response to comparing the common mode value to the predetermined common mode value;

a first subtraction module having an input to accept the first digital value and an input to accept the second digital value, the first subtraction module subtracting the second digital value from the first digital value to supply a digital output value, equivalent to the differential analog input value, at an output;

wherein the first VCO and second VCO accept a frequency modification control signal, responsive to the first error signal; and, wherein the first comparator supplies a minimized first error signal value in response to the frequency modification control signal.

20. A method for calibrating the mean frequency of a voltage controlled oscillator (VCO) based analog-to-digital converter (ADC), the method comprising:

accepting a differential analog input signal comprising a positive signal and a negative signal;

converting the positive signal into a first frequency;

converting the negative signal into a second frequency;

converting the first frequency into a first digital value;

converting the second frequency into a second digital value;

adding the first digital value to the second digital value to find a common mode value;

comparing the common mode value to a predetermined common mode value to find a first error;

in response to the first error, modifying the first and second frequencies; and, in response to the modifying the first and second frequencies, minimizing the first error.

\* \* \* \* \*